United States Patent
Kravtchenko et al.

(10) Patent No.: US 6,208,009 B1
(45) Date of Patent: Mar. 27, 2001

(54) RC-NETWORKS IN SEMICONDUCTOR DEVICES AND METHOD THEREFOR

(75) Inventors: Dmitri G. Kravtchenko; Vladimir A. Khrustalev, both of Moscow (RU)

(73) Assignee: Digital Devices, Inc., North Miami, FL (US)

( * ) Notice: Subject to any disclaimer, the term of this patent is extended or adjusted under 35 U.S.C. 154(b) by 0 days.

(21) Appl. No.: 09/303,713

(22) Filed: Apr. 30, 1999

(51) Int. Cl.[7] ................................................ H01L 29/00
(52) U.S. Cl. ...................... 257/533; 257/532; 257/535; 257/536; 257/528; 438/329; 438/382; 438/957
(58) Field of Search ................................. 257/532, 533, 257/528, 536; 438/382, 329, 957

(56) References Cited

U.S. PATENT DOCUMENTS

| | | | |
|---|---|---|---|
| 3,781,610 | * 12/1973 | Bodway | 317/101 |
| 4,866,502 | 9/1989 | Tomaszewski . | |
| 5,268,315 | * 12/1993 | Prasad et al. | 437/31 |
| 5,541,442 | 7/1996 | Keil . | |
| 5,652,460 | * 7/1997 | Kalb et al. | 257/536 |
| 5,670,819 | * 9/1997 | Yamaguchi | 257/536 |
| 5,682,060 | 10/1997 | Tung . | |

FOREIGN PATENT DOCUMENTS

WO 96/36993  11/1996 (WO) .

* cited by examiner

*Primary Examiner*—Eddie C. Lee
*Assistant Examiner*—Jesse A. Fenty
(74) *Attorney, Agent, or Firm*—Jeffrey Weiss; Jeffrey D. Moy; Weiss & Moy, P.C.

(57) ABSTRACT

An improved RC network integrated circuit semiconductor device is disclosed which incorporates an improved method for fabrication. The new device and method includes the use of a tantalum nitride layer as the resistive material for the resistor and a protective metal layer formed between the resistive layer and a metal interconnect layer. The capacitor uses a metal electrode as one plate of the capacitor and a heavily doped semiconductor region as the other plate of the capacitor and separated from the one plate of the capacitor by a silicon nitride insulation layer.

20 Claims, 4 Drawing Sheets

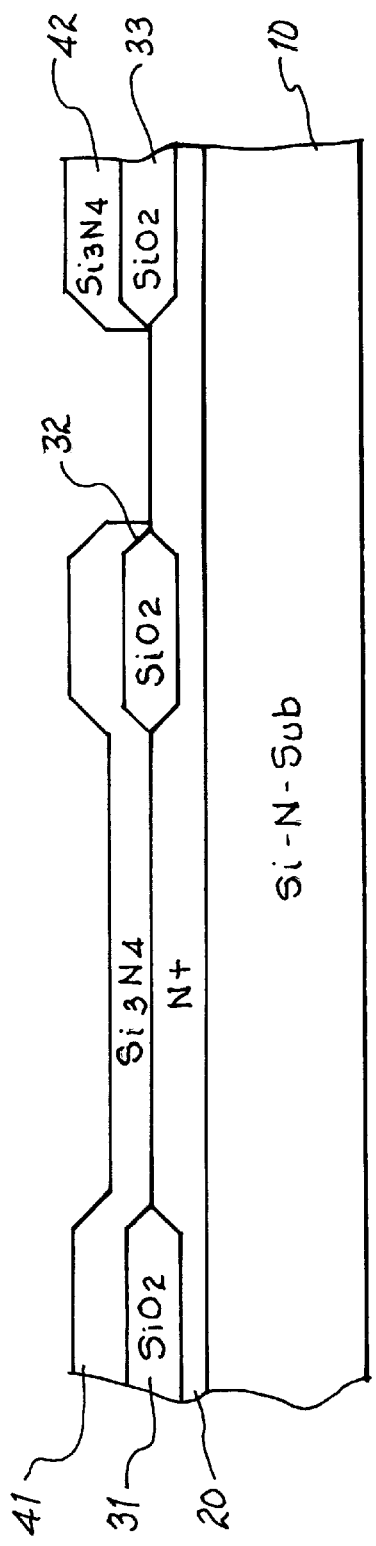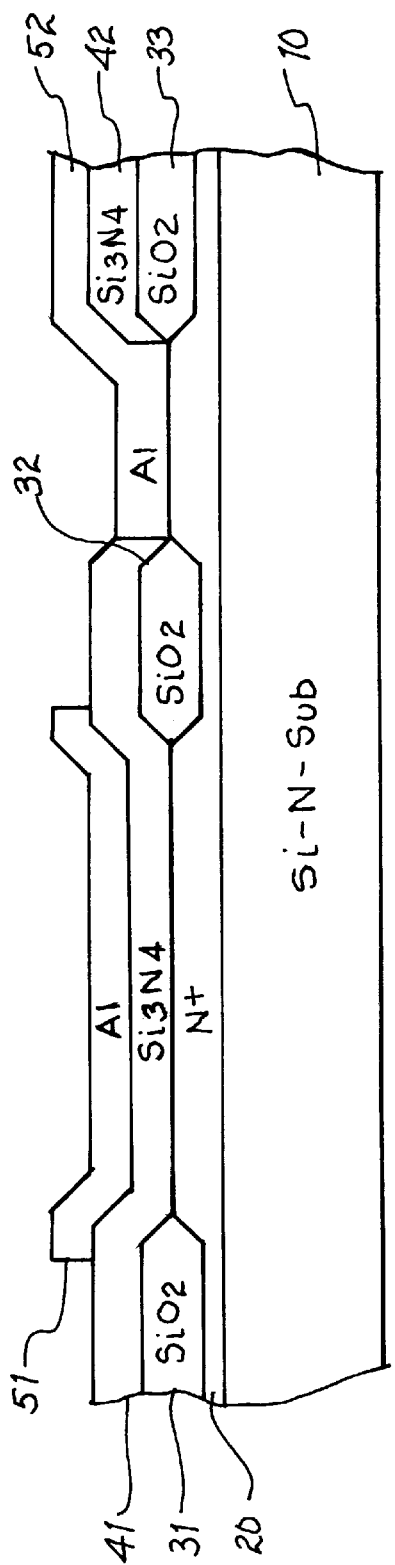

RC-NETWORKS IN SEMICONDUCTOR DEVICES AND METHOD THEREFOR

CROSS-REFERENCE TO RELATED APPLICATIONS

This application is related to U.S. patent applications entitled Semiconductor Device And Method Of Forming A Semiconductor Structure To Provide Electrostatic Discharge Protection and Semiconductor Structure and Zener Diode And RC Network Combination Semiconductor Device For Use In Integrated Circuits and Method Therefor, which are filed concurrently with the present U.S. patent application. The present U.S. patent application and the related applications are assigned to the same assignee.

BACKGROUND OF THE INVENTION

1. Field of the Invention

This invention relates generally to semiconductor devices and to the fabrication of semiconductor devices, and more specifically, this invention relates to RC-Networks in semiconductor devices and to a fabrication method for semiconductor devices comprising Resistor-Capacitor (RC) networks. Variations of semiconductor devices comprising RC networks include devices such as Resistor-Capacitor-Diode (RCD) networks and Resistor-Capacitor-Inductor (RCL) networks.

2. Description of the Related Art

In the prior art, certain methods of improving the electrical conductivity of capacitor electrodes in semiconductor devices using thin film polysilicon plates have been disclosed. One such approach may be found in Tung et al. (Tung) U.S. Pat. No. 5,682,060 issued on Oct. 28, 1997. Tung discloses a process for fabricating a capacitor component in a semiconductor device which is comprised of a bottom doped polysilicon plate, a dielectric layer, typically oxide or oxide/nitride/oxide (ONO), and a top doped polysilicon plate.

Following the deposition and doping of the top polysilicon plate, a layer of metal silicide, preferably titanium silicide, is formed on the top doped polysilicon plate. The titanium silicide layer is formed when the device is heated to a temperature of 675 deg. C. for a period of 30 minutes after a layer of titanium is deposited on the top doped polysilicon layer. The result is the formation of titanium silicide over the top doped polysilicon plate thereby improving the electrical conductivity of the top plate. The unreacted titanium is removed by a chemical process well known in the art. Fabrication of the remainder of the device including isolation layers and metal contacts may then be completed.

The disadvantages of the above described Tung patented method are the time and cost involved with the thermal or heating process to produce the titanium silicide. There may also be process inconsistencies or incompatibilities with the metal silicide formation approach resulting in electrical anomalies across the numerous devices typically fabricated in a single integrated circuit type of silicon wafer.

Other methods which use tantalum nitride or other types of nitride for a resistive layer have the very severe problem of nitrogen contamination of the capacitor electrodes, the metal contacts to the capacitor electrodes and/or the metal interconnect layer or layers. Nitrogen contamination results, for example, in instability in the capacitive devices.

Therefore, a solution to the above described limitations imposed by nitrogen contamination found in the prior art and by the metal silicide prior art method for fabricating capacitors to be used in an integrated circuit using semiconductor devices was needed, particularly for those semiconductor devices or integrating circuits incorporating RC networks.

BRIEF SUMMARY OF THE INVENTION

It is an object of the present invention to provide an improved RC network semiconductor device which has a simplified structure and improved method therefor.

It is another object of the present invention to provide an improved RC network semiconductor device which may be manufactured by reducing the number of thermal or heating processes required and an improved method therefor.

It is still another object of the present invention to provide an improved RC network semiconductor device which is more reliable and less costly to manufacture and an improved method therefor.

It is a further object of the present invention to provide an RC network semiconductor device which reduces the instability caused by contaminating the metal interconnect layer with nitrogen from the deposition of a resistive layer of tantalum nitride by forming a protective metal layer between the metal interconnect layer and the tantalum nitride resistive layer and an improved method therefor.

It is a still further object of the present invention to provide an improved RC network semiconductor device which uses a dielectric layer comprising silicon nitride between capacitor electrodes and an improved method therefor.

The foregoing and other objects, features, and advantages of the invention will be apparent from the following, more particular, description of the preferred embodiments of the invention, as illustrated in the accompanying drawings.

BRIEF DESCRIPTION OF THE PREFERRED EMBODIMENTS

In accordance with one embodiment of this invention, a integrated circuit semiconductor device is provided which comprises, in combination, at least one capacitor device and at least one resistor device: a semiconductor substrate; a capacitor device having one electrode spaced from the substrate, a second electrode of the capacitor device comprises a heavily doped semiconductor region, the capacitor device having a dielectric layer located between the one electrode and second electrode; and a resistor device spaced further away from the substrate than the capacitor device, the resistor device comprising a layer portion of resistive material, protective metal layer portions located on an exposed surface portion of the layer of resistive material and spaced apart metal contacts in electrical contact with spaced apart portions of the resistive material through electrical contact with intermediate spaced apart portions of the protective metal layer that cover the spaced apart portions of the resistive material.

In accordance with another embodiment of this invention, a method is disclosed of forming an integrated circuit semiconductor device which comprises, at least one capacitor device and at least one resistor device which method comprises the steps of: providing a semiconductor substrate; forming a capacitor device having one electrode spaced from the substrate, a second electrode of the capacitor device comprises a heavily doped semiconductor region, the capacitor device having a dielectric layer located between the one electrode and second electrode; and forming a resistor device spaced further away from the substrate than the capacitor device, the resistor device comprising a layer portion of resistive material, protective metal layer portions located on an exposed surface portion of the layer of resistive material and spaced apart metal contacts in electrical contact with spaced apart portions of the resistive material through electrical contact with intermediate spaced apart portions of the protective metal layer that cover the spaced apart portions of the resistive material.

BRIEF DESCRIPTION OF THE SEVERAL VIEWS OF THE DRAWINGS

FIG. 3 is a cross sectional elevation view of a subsequent phase of the fabrication process of the improved semiconductor integrated circuit device of this invention illustrating the formation and etching or patterning of a silicon nitride dielectric layer on the top surface of the semiconductor structure of FIG. 2.

FIG. 4 is a cross sectional elevation view of a subsequent phase of the fabrication process of the improved semiconductor integrated circuit device of this invention illustrating the formation and etching, or patterning of a metal layer to be subsequently used as the top electrode of a capacitor device for the improved semiconductor integrated circuit device.

DETAILED DESCRIPTION OF THE INVENTION

In the detailed description provided below, several phases in the fabrication process of the RC semiconductor integrated circuit device of this invention are disclosed. In reference to each of the figures, like numerals represent like elements as between the different phases of the fabrication process. The thickness of the deposition layers illustrated by the diagrams are not necessarily drawn to scale. In fact, in certain diagrams the thickness of the deposition layers is intentionally exaggerated for purposes of visual clarity in understanding the fabrication process and semiconductor structure of this invention.

Figure 1:
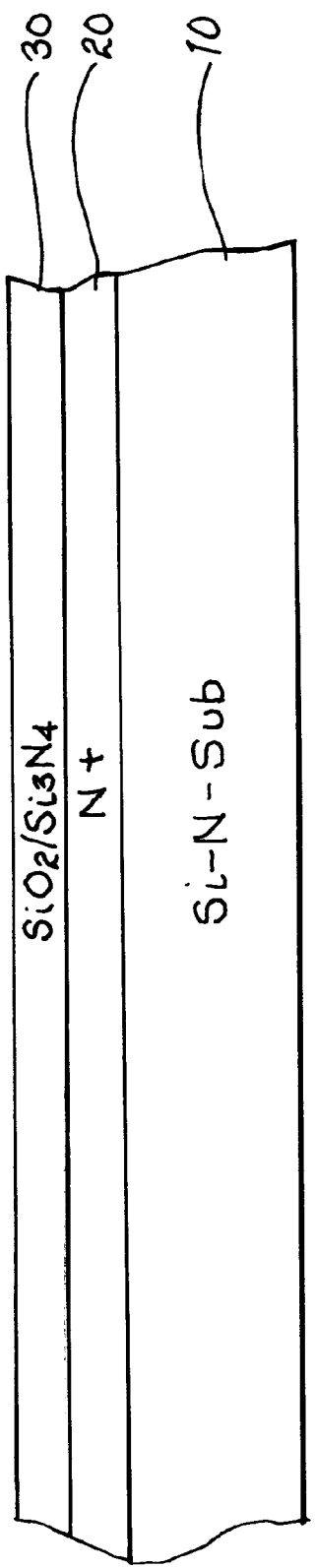
FIG. 1 is a cross sectional elevation view of an early stage of the fabrication process of an improved semiconductor integrated device of this invention illustrating an N type silicon substrate, the formation of an N+ type layer on the N type silicon substrate and the formation of a silicon dioxide silicon nitride dielectric insulation layer on the N+ type layer.

Referring to FIG. 1, a relatively early phase in the fabrication process in forming the semiconductor structure of the present invention is illustrated. A starting N or N– type silicon substrate 10 contains N type impurities such as arsenic, phosphorous, etc. The substrate 10 is doped to a desired level to provide optimum electrical characteristics for a starting N or N– type substrate.

Initially, an N+ type region 20 is implanted or diffused into the N or N– type substrate 10. The N+ type region 20 will subsequently form the bottom electrode of the capacitor component fabricated within the integrated semiconductor structure of this invention. If desired, the starting substrate 10 can be a P or P– type substrate containing a P type dopant such as boron and the region 20 would then be a P+ region. Subsequent to the creation of the N+ type region 20, a dielectric layer 30 preferably comprised of both a thin layer of thermally grown or deposited silicon dioxide followed by a deposited thin silicon nitride layer is formed on the top surface of the N+ type region 20.

Figure 2:
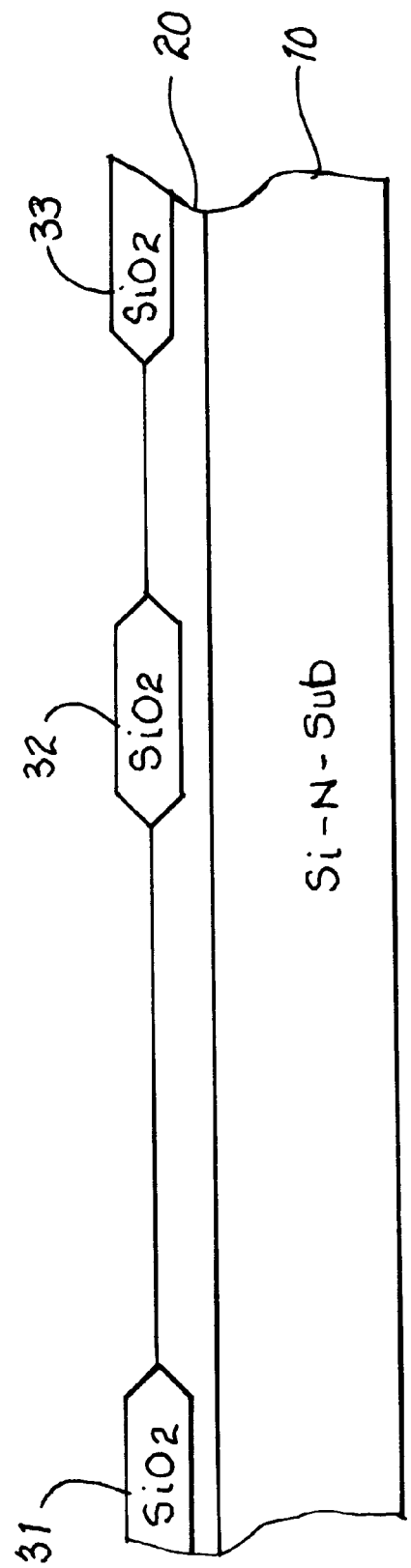
FIG. 2 is a cross sectional elevational view of a subsequent phase of the fabrication process of the improved semiconductor integrated circuit device of this invention illustrating the formation of several silicon dioxide isolation regions on surface portions of the N+ type layer.

Referring to FIG. 2 and using standard photolithographic techniques of masking and etching and using the combined silicon dioxide and silicon nitride layer 30 (see FIG. 1) as a masking layer, spaced apart oxide isolation regions are created by first creating openings in the dielectric layer 30 (of FIG. 1) and then thermally growing relatively thick silicon dioxide regions in these openings. In the embodiment shown in FIG. 2, there are three silicon dioxide isolation type regions 31, 32, and 33 formed in the openings in the dielectric layer 30 (of FIG. 1). Different embodiments may require more or less of these oxide isolation regions. After the oxide isolation regions 31–33 are created, the dielectric layer 30 is removed such as by etching techniques and the structure is annealed at high temperature, thereby resulting in greater penetration of the oxide isolation regions 31–33 into the N+ region 20.

Referring to FIG. 3, a subsequent phase in the fabrication process in forming the semiconductor structure of the present invention is illustrated. A silicon nitride layer is deposited on the top surface of the semiconductor structure of FIG. 2. The silicon nitride layer covers exposed surface areas of both the N+ region 20 and the isolation type oxide regions 31–33. An aperture is etched or otherwise formed into the silicon nitride layer resulting in two, separate silicon nitride dielectric layer portions or regions 41 and 42 as shown in FIG. 3.

Referring to FIG. 4, a later phase in the fabrication process in forming the semiconductor structure of the present invention is illustrated. A metal layer is deposited on the surface of the semiconductor structure of FIG. 3. In the preferred embodiment, the metal layer is comprised of aluminum (or an alloy of aluminum containing a small amount of copper). The metal layer is subsequently etched or patterned to form metal electrodes 51 and 52. The metal electrode 51 is used as the top metal electrode of the capacitor whereas the metal electrode 52 is used to contact the N+ region 20 (a portion of which is below the Ax silicon nitride (capacitor dielectric) region between the N+ region 20 and the top metal electrode 51). Thus, the bottom electrode of the capacitor is the semiconductor N+ region 20 (and its associated metal contact 52).

Figure 5:
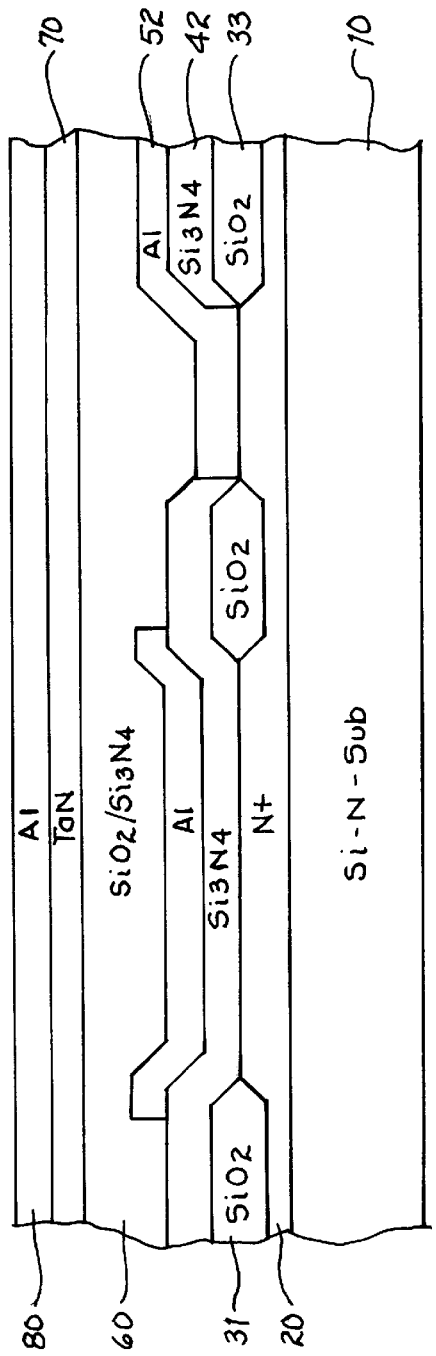
FIG. 5 is a cross sectional elevation view of a subsequent phase of the fabrication process of the improved semiconductor integrated circuit device of this invention illustrating the formation of a silicon dioxide silicon nitride dielectric layer followed by the formation of a resistive layer comprised of tantalum nitride and then followed by the formation of a protective metal layer thereon.

Referring to FIG. 5, a still later phase in the fabrication process in forming the semiconductor structure of the present invention is shown. First, a relatively thick dielectric layer 60 is deposited on the top surface of the semiconductor structure of FIG. 4. In the preferred embodiment, this relatively thick dielectric layer 60 is comprised of silicon dioxide and silicon nitride successive layers or a three layer combination of silicon dioxide, silicon nitride and silicon dioxide, i.e ONO layer (silicon dioxide—silicon nitride—silicon dioxide).

As shown in FIG. 5, the next step in the fabrication process of the RC semiconductor structure of this invention is the deposition of a resistive layer 70 to be used to provide the resistor of the RC semiconductor structure on this invention. In the preferred embodiment, the resistive layer 70 is comprised of tantalum nitride.

As further shown in FIG. 5, subsequent to the deposition of the resistive layer 70, a protective metal layer 80 is deposited on the semiconductor structure of this invention to protect and cover the underlying tantalum nitride layer 70. In the preferred embodiment, the protective metal layer 80 is comprised of aluminum (or an alloy of aluminum (i.e. Aluminum-Copper)). The protective metal layer 80, which is formed above and in contact with a surface portion of the resistive layer 70 is extremely, important because it reduces the likelihood of very undesired nitrogen contamination of the metal interconnect layer (as discussed below) and to the is metal electrodes 51 and 52 of the capacitor.

Figure 6:
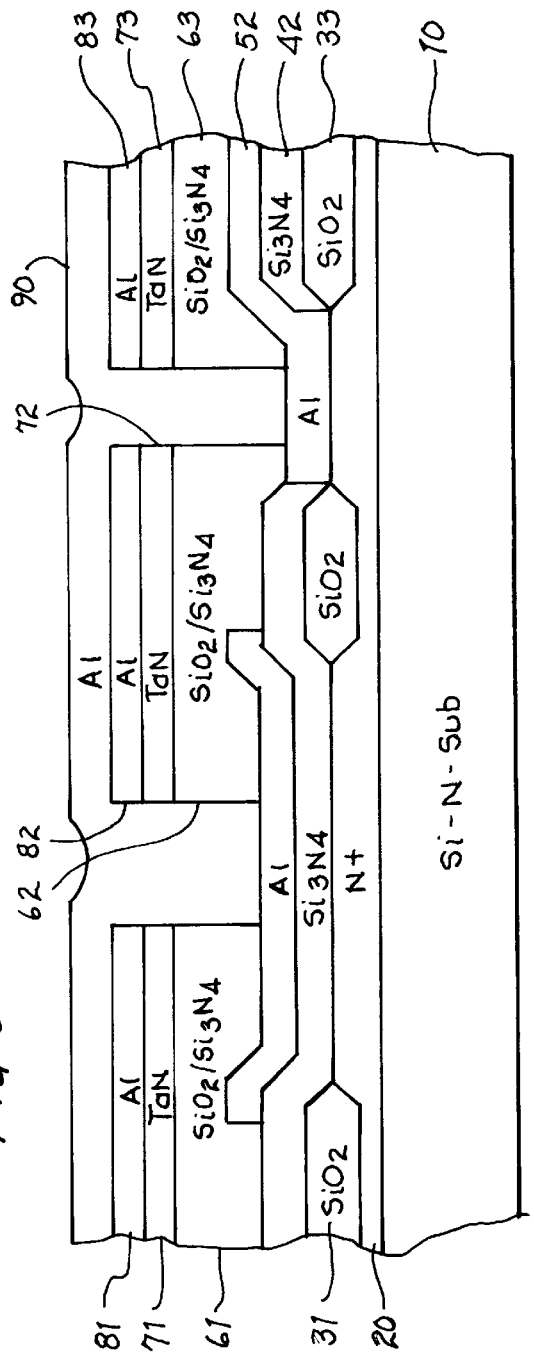
FIG. 6 is a cross sectional elevation view of still a later phase of the fabrication process of the improved semiconductor integrated circuit device of this invention illustrating the semiconductor structure after the formation of contact vias through the metal layer, the resistive tantalum nitride layer and the silicon dioxide layer and after the subsequent deposition of a top metal interconnect layer.

Referring to FIG. 6, a subsequent phase in the fabrication process in forming the semiconductor structure of the present invention is illustrated. The initial step in the fabrication process for the resulting semiconductor structure shown in FIG. 6 is the use of photolithographic masking and etching techniques to permit etching of contact vias successively through the protective metal layer 80, the resistive layer 70 and the dielectric layer 60 (for the semiconductor structure shown in FIG. 5).

The resulting vias leave three separated or separate vertically stacked regions as shown in FIG. 6. One stacked region (as shown on the left) is comprised of dielectric region 61, resistive region 71 and protective metal region 81. Another (central) stacked region is comprised of dielectric region 62, resistive region 72 and protective metal region 82. Still another stacked region (as shown on the right) is comprised of dielectric region 63, resistive region 73 and protective metal region 83. In concert with the protective metal regions 81–83 and by penetrating the stacked regions, the vias minimize undesired nitrogen contamination of the metal contacts to the metal electrodes 51 and 52 of the capacitor.

Finally, as shown in the semiconductor structure of FIG. 6, a metal interconnect layer 90 is deposited over the surface of the semiconductor. The metal interconnect layer 90 is comprised of aluminum (or an alloy of aluminum). The deposition of the metal interconnect layer 90 fills the two vias opened between the three stacked regions and this metal layer 90 make physical and electrical contact with the metal electrodes 51 and 52 of the capacitor.

Figure 7:
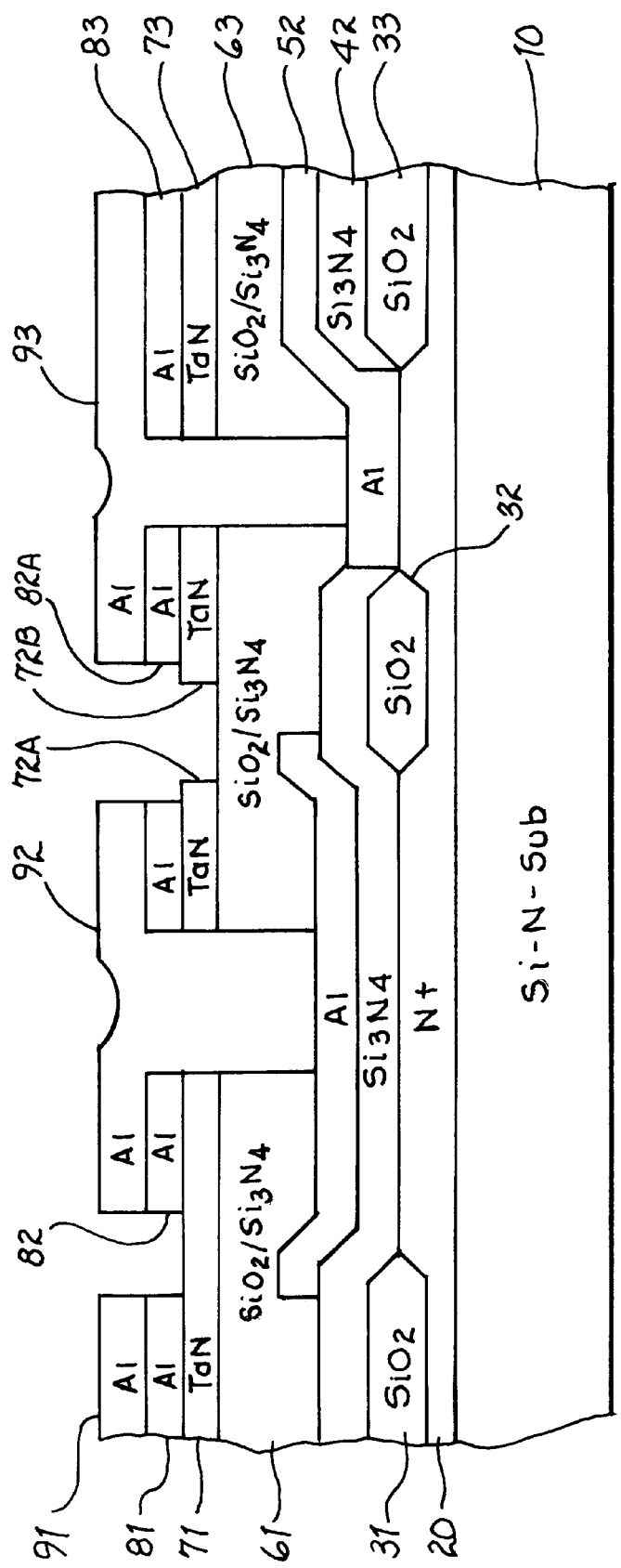
FIG. 7 is a cross sectional elevation view of the completion phase of the fabrication process of the improved semiconductor integrated circuit device of this invention illustrating the semiconductor structure after the patterning of the top metal interconnect layer to provide electrical connections as required by the design of the electrical integrated circuit.

Referring to FIG. 7, the final phase of the fabrication process in forming the semiconductor structure of the present invention is illustrated. In this last phase, the metal interconnect layer 90 has been masked and etched according to standard photolithographic techniques to provide electrical separation and an interconnect pattern to provide the integrated circuit design for this invention. As shown in FIG. 7, for example, metal interconnect layer or region 91 is electrically isolated from metal interconnect layer or region 92. Thus, the metal region 91 provides (by means of electrical contact with underlying protective metal region 81) one electrical contact for the resistor device because of electrical contact (through the underlying protective metal region 81) to the resistive material 71. The other metal contact to the resistive material 82 (thereby providing the second resistor contact) is provided by metal region 92 which provides electrical contact to the resistive material 71 through underlying protective metal region 82 (while spaced apart from the other underlying protective metal region 81). The metal region 92 also provides electrical contact to the resistive material 72A (located on the other (right) side of the left side via) because of contact with underlying protective metal layer 82A. A second contact 93 to the resistive material 72B (through contact with underlying metal region 82B) to provide, in effect, a second resistor device is prevented because of an opening (to create an "open") between metal regions 92 and 93, between protective metal regions 82A and 82B and between resistive regions 72A and 72B.

This invention has overcome metal contact instability when using tantalum nitride for the resistive material for a resistor. Previously, underlying metal conductors became saturated with nitrogen which occurred when the tantalum nitride material was deposited using the deposition techniques of magnetron sputtering of tantalum in a nitrogen plasma wherein the underlying metal (aluminum) layer or surface portions were exposed to the nitrogen plasma during this tantalum nitride deposition process.

The use of the silicon nitride dielectric layer as the capacitor dielectric permits the capacitor of the semiconductor integrated circuit device of this invention to restore its capacitor properties after a high voltage breakdown.

In summary, the device and method of this invention permits the manufacture of RC semiconductor integrated circuit device networks with high quality, reliable and stable metal contacts.

Although the invention has been particularly shown and described with reference to a preferred embodiment thereof, it will be understood by those skilled in the art that changes in form and detail may be made therein without departing from the spirit and scope of the invention.

What is claimed is:

1. An integrated circuit semiconductor device comprising, in combination at least one capacitor device and at least one resistor device:

a semiconductor substrate;

a capacitor device having one electrode spaced from said substrate, a second electrode of said capacitor device comprises a heavily doped semiconductor region, said capacitor device having a dielectric layer located between said one electrode and second electrode; and a resistor device spaced further away from said substrate than said capacitor device, said resistor device comprising a layer portion of resistive material, protective metal layer portions located on exposed surface portions of said layer of resistive material and spaced apart metal contacts in electrical contact with spaced apart portions of said resistive material through electrical contact with intermediate spaced apart portions of said protective metal layer that cover said spaced apart portions of said resistive material.

2. The device of claim 1 wherein said resistive material is tantalum nitride.

3. The device of claim 1 wherein said protective metal layer portions comprising aluminum.

4. The device of claim 2 wherein said protective metal layer portions comprising aluminum.

5. The device of claim 1 wherein said spaced apart metal contacts comprising aluminum.

6. The device of claim 2 wherein said spaced apart metal contacts comprising aluminum.

7. The device of claim 3 wherein said spaced apart metal contacts comprising aluminum.

8. The device of claim 1 wherein said dielectric layer of said capacitor device comprising silicon nitride.

9. The device of claim 8 wherein said second electrode of said capacitor device further comprising a metal electrode in contact with a surface portion of said heavily doped semiconductor region.

10. The device of claim 1 wherein said semiconductor substrate is of N type conductivity, said heavily doped semiconductor region is of N+ type conductivity and located on at least a surface portion of said substrate of N type conductivity, said resistive material is tantalum nitride, said protective metal layer portions comprising aluminum, said spaced apart metal contacts comprising aluminum, said dielectric layer of said capacitor device comprising silicon nitride, said second electrode of said capacitor device further comprising a metal electrode in contact with a surface portion of said heavily doped semiconductor region, said one electrode of said capacitor device being electrically connected to one of said spaced apart metal contacts of said resistor device.

11. A method of forming an integrated circuit semiconductor device comprising at least one capacitor device and at least one resistor device which method comprises the steps of:

providing a semiconductor substrate;

forming a capacitor device having one electrode spaced from said substrate, a second electrode of said capacitor device comprises a heavily doped semiconductor region, said capacitor device having a dielectric layer located between said one electrode and said second electrode; and forming a resistor device spaced further away from said substrate than said capacitor device, said resistor device comprising a layer portion of resistive material, protective metal layer portions located on exposed surface portions of said layer of resistive material and spaced apart metal contacts in electrical contact with spaced apart portions of said resistive material through electrical contact with intermediate spaced apart portions of said protective metal layer that cover said spaced apart portions of said resistive material.

12. The method of claim 11 wherein said resistive material is tantalum nitride.

13. The method of claim 11 wherein said protective metal layer portions comprising aluminum.

14. The method of claim 12 wherein said protective metal layer portions comprising aluminum.

15. The method of claim 11 wherein said spaced apart metal contacts comprising aluminum.

16. The method of claim 12 wherein said spaced apart metal contacts comprising aluminum.

17. The method of claim 13 wherein said spaced apart metal contacts comprising aluminum.

18. The method of claim 11 wherein said dielectric layer of said capacitor device comprising silicon nitride.

19. The method of claim 18 wherein said second electrode of said capacitor device further comprising a metal electrode in contact with a surface portion of said heavily doped semiconductor region.

20. The method of claim 11 wherein said semiconductor substrate is of N type conductivity, said heavily doped semiconductor region is of N+ type conductivity and located on at least a surface portion of said substrate of N type conductivity, said resistive material is tantalum nitride, said protective metal layer portions comprising aluminum, said spaced apart metal contacts comprising aluminum, said dielectric layer of said capacitor device comprising silicon nitride, said second electrode of said capacitor device further comprising a metal electrode in contact with a surface portion of said heavily doped semiconductor region, said one electrode of said capacitor device being electrically connected to one of said spaced apart metal contacts of said resistor device.

\* \* \* \* \*